(12) United States Patent
Brunet et al.

(10) Patent No.: US 6,420,211 B1
(45) Date of Patent: Jul. 16, 2002

(54) METHOD FOR PROTECTING AN INTEGRATED CIRCUIT CHIP

(75) Inventors: Olivier Brunet; Didier Elbaz, both of Marseille; Bernard Calvas, Aubagne; Philippe Patrice, Allauch, all of (FR)

(73) Assignee: Gemplus, Gemenos Cedex (FR)

( * ) Notice: Subject to any disclaimer, the term of this patent is extended or adjusted under 35 U.S.C. 154(b) by 0 days.

(21) Appl. No.: 09/889,121

(22) PCT Filed: Dec. 23, 1999

(86) PCT No.: PCT/FR99/03282

§ 371 (c)(1),
(2), (4) Date: Jul. 11, 2001

(87) PCT Pub. No.: WO00/42653

PCT Pub. Date: Jul. 20, 2000

(51) Int. Cl.⁷ .......................... H01L 21/44; H01L 21/48; H01L 21/50; H01L 23/22
(52) U.S. Cl. .................. 438/113; 438/110; 438/121; 438/124; 438/125; 438/126; 438/127; 438/460; 438/464; 257/687; 257/701; 257/702; 257/723; 257/724
(58) Field of Search ................. 438/110, 113, 438/121, 124–127, 460, 464; 257/687, 701, 702, 723, 724

(56) References Cited

U.S. PATENT DOCUMENTS

| | | |
|---|---|---|
| 3,781,975 A | 1/1974 | Ressel et al. |
| 5,032,543 A | 7/1991 | Black et al. |
| 5,547,906 A | 8/1996 | Badehi |
| 5,682,065 A | 10/1997 | Farnworth et al. |

FOREIGN PATENT DOCUMENTS

FR 2750250 A 12/1997

Primary Examiner—John F. Niebling
Assistant Examiner—David A. Zarneke
(74) Attorney, Agent, or Firm—Burns Doane Swecker & Mathis LLP

(57) ABSTRACT

The invention concerns a method for protecting integrated circuit chips of a silicon wafer. The silicon wafer is cut so as to disengage the chips from the integrated circuit; and a fluid insulating material is applied on the rear surface of the wafer so as to coat the flanks of each chip of the integrated circuit with a thin insulating layer. The insulating material may be applied by spraying, screen printing, dip coating, casting or any other means. The invention further concerns integrated circuit chips where the flanks are protected by an insulating material to prevent electrical malfunction caused by contact of a conductive material on the flanks of the chips.

24 Claims, 2 Drawing Sheets

US 6,420,211 B1

METHOD FOR PROTECTING AN INTEGRATED CIRCUIT CHIP

This disclosure is based upon, and claims priority from French Application No. 99/00196, filed on Jan. 11, 1999 and International Application No. PCT/FR99/03282, filed Dec. 23, 1999, which was published on Jul. 20, 2000 in a language other than English, the contents of which are incorporated herein by reference.

BACKGROUND OF THE INVENTION

The invention relates to the field of integrated circuit chips.

The present invention relates to more particularly a method for protecting an integrated circuit chip in order to insulate its flanks when the chip is connected with a connection terminal block.

The connection of integrated circuit chips with a connection terminal block on a card, for example, can be effected by traditional wiring or by other techniques using conductive polymer compounds in contact with the output pads on the chip.

The traditional technology of wiring for the connection of chips requires no specific characteristic for the component constituting the integrated circuit. However, such a technology is tricky and expensive. This is because wires, generally made from copper, nickel or gold, connect the output pads on the chip to the connecting tracks of the printed circuit by soldering. In addition, this wiring technique requires high-precision equipment for making the connections, which causes a slow-down in the manufacturing rate.

In order to mitigate the drawbacks of this traditional technology, use is being made more and more often of conductive polymer compounds establishing contact between the output pads of the chip and the connecting tracks of the connection terminal block.

A first method using a conductive polymer compound for connecting the chip to the connecting tracks is illustrated in FIG. 1.

In such a case, the connecting tracks 12 are brought close to the location provided for the chip 100. The latter is bonded by the rear face 104 to the connecting tracks 12 of the connection terminal block using an insulating glue 15. This glue can for example be an adhesive cross-linking under the effect of exposure to ultraviolet radiation.

The electrical connections between the output pads 120 on the chip 100 and the connecting tracks 12 are then made by dispensing a conductive resin 40 which covers the output pads 120 on the chip 100 and the connecting tracks 12 on the card. This conductive resin 40 can for example be a polymerisable glue containing conductive particles such as silver particles.

A second method using a conductive polymer compound for connecting the chip to the connecting tracks is illustrated in FIG. 2. This method consists in attaching the chip according to a well-known mounting of the "flip chip" type.

In a mounting of the "flip chip" type, the chip 100 is turned with the active face with the output pads 120 downwards. The chip 100 is then connected by placing the output pads 120 on the connecting tracks 12 printed at the location provided for the chip.

In the example illustrated, the chip 100 is connected to the connecting tracks 12 by means of a glue 35 with isotropic electrical conduction, well-known and often used for the surface mounting of passive components.

These techniques of connecting chips by means of conductive polymers are very effective and of high performance. They have many advantages compared with the traditional technique of wiring and is tending to become widespread amongst integrated circuit assemblers. This is because these techniques use a conductive polymer making it possible to reduce the number of manufacturing operations so as to appreciably reduce the manufacturing cost of the materials of the integrated circuits.

Nevertheless, the inventors have detected a particular problem which is directly related to these connection techniques when the substrate used has a conductive flank.

It can be seen clearly in FIG. 1 that the conductive resin 40 covers the flanks 106 of the chip 100. It has however been established that, in certain cases, a conductivity on the flank 106 of the chip 100 can give rise to electrical malfunctioning of the integrated circuit. This is because, depending on the type of substrate used, the flank of the chip is insulating or conductive. If the flank is insulating, there is no problem with the conductive resin 40 being in contact with the edge.

Nevertheless, in the case where the substrate used for manufacturing the integrated circuit chip has a conductive flank, this technique cannot be used.

Likewise, it can be seen clearly in FIG. 2 that the conductive glue 35 can be caused to rise slightly on the edges of the chip 100 and thus cause electrical malfunctioning of the integrated circuit.

The solution used up to the present time consisted quite simply in not using this type of connection technique with chips having conductive flanks. This solution is however not satisfactory since it greatly limits the possibilities of the assembler, obliging him to use certain products with certain assembly techniques.

In fact the conductivity of silicon is directly related to the wafer manufacturing process and differs according to the manufacturers and the production lines. A user wishing to specify a particular conductivity of the substrate will then be linked to a given supplier and even to a given product range, which automatically gives rise to additional cost and a limitation in the products which he may use.

SUMMARY OF THE INVENTION

The purpose of the present invention is to resolve the problems disclosed above.

The purpose of the present invention is to eliminate the drawbacks related to the connection of the integrated circuit chips by technologies using conductive polymers.

To this end, the present invention proposes a method for protecting the flanks of integrated circuit chips in order to insulate them from the conductive polymer components used for. connecting the output pads of the chips with the connecting tracks of the connection terminal blocks.

In particular, the present invention proposes a method for protecting integrated circuit chips on a silicon wafer, the wafer having a front face on which the integrated circuit chips are disposed and an opposite rear face, characterised in that the method comprises the following steps:

cutting out the silicon wafer so as to disconnect the integrated circuit chips;

applying a fluid insulating material to the rear face of the wafer so as to cover the flanks of each integrated circuit chip with a thin insulating layer.

The method for protecting integrated circuit chips according to the present invention is also characterised in that it additionally comprises a step of transferring the cut-out wafer, with the rear face upwards, onto a support so as to ensure the cohesion of the chips during the application of the insulating material.

According to one characteristic, the application of the insulating material is effected by spraying on the rear face of the chips.

According to another characteristic, the application of the insulating material is effected by screen printing using a doctor blade and a screen on the rear face of the chips.

According to another characteristic, the application of the insulating material is effected by pouring on the rear face of the chips.

According to another characteristic, the application of the insulating material is effected by dipping the chips in a tank containing the insulating material.

According to another characteristic, the application of the insulating material is effected by dispensing the insulating material on the rear face of the chips, the said chips being placed on a rotating rotary tray.

According to one characteristic, the insulating material has low viscosity so as to run along the flanks of the chips.

According to another characteristic, the insulating material consists of a resin of the epoxy type having high hardness and good adhesion to the silicon.

According to another characteristic, the insulating material consists of an insulating lacquer with a low dry extract so as to obtain a thin insulating coating.

According to another characteristic, the insulating material consists of a coloured resin so as to allow a check on the areas covered with the insulating material.

According to another characteristic, the check on the areas covered with the insulating material is effected by computer-aided vision (CAV).

The method for protecting integrated circuit chips according to the present invention is also characterised in that it comprises the following steps:

deposition of a protection on the rear face of the silicon wafer;

cutting out the silicon wafer so as to disconnect each integrated circuit chip;

transferring the disconnected integrated circuit chips, rear face upwards, onto a support;

removing the protection from the rear face;

applying an insulating material to the rear face and the flanks of the chips;

ejecting the chips from the support;

connecting the chips.

According to one characteristic, the protection of the rear face of the silicon wafer consists of an adhesive which is degradable under ultraviolet, the said adhesive being degraded after the step of cutting out the wafer and removed by peeling off.

According to another characteristic, the support is a degradable adhesive exposed to ultraviolet radiation after application of the insulating material.

According to another characteristic, the ejection of the chips is effected by breaking the insulating material deposited on the support between the chips.

According to another characteristic, the ejection of the chips is effected by cutting the support.

According to another characteristic, the insulating material consists of a photosensitive resin polymerised through a mask at the level of the rear faces and flanks of the chips.

According to this characteristic, the chips are disconnected by exposing the wafer to ultraviolet radiation through a mask so as to facilitate the ejection of the chips.

The present invention also relates to an integrated circuit chip characterised in that it comprises an insulating material applied to its flanks so as to constitute a protection.

According to another characteristic, the insulating material covering the flanks of the chip consists of a resin of the epoxy type and/or an insulating lacquer and/or a polymerised photosensitive resin and/or a coloured resin.

The method according to the invention has the advantage of allowing the systematic use of techniques of direct connection between the output pads of a chip and the connecting tracks of a terminal block with a conductive glue whatever the chip used.

The method according to the invention can advantageously be used with any type of chip whatever the substrate used, whatever the size and shape of the chip, and whether or not it has protrusions.

The method according to the present invention is easy to implement. Although it requires an additional step preceding the connection of the chips, the protection method according to the invention does not give rise to any significant additional cost nor extended manufacturing time.

BRIEF DESCRIPTION OF THE DRAWINGS

Other particularities and advantages of the present invention will emerge during the following description given by way of illustrative and non-limitative example with reference to the figures, in which.

DETAILED DESCRIPTION

The method according to the present invention includes several steps.

A first step consists in cutting out the silicon wafer 10 on which the integrated circuit chips 100 are disposed in order to disconnect them.

To this end, the rear face 104 of the wafer, opposite the front face on which the chips are disposed, is placed on an adhesive 115 degradable under ultraviolet, for example. The silicon wafer is then cut out according to known conventional methods and the disconnected chips 100 are held together by the adhesive 115.

The degradable adhesive 115 is then exposed to ultraviolet radiation in order to reduce its adhesive strength.

Figure 1:
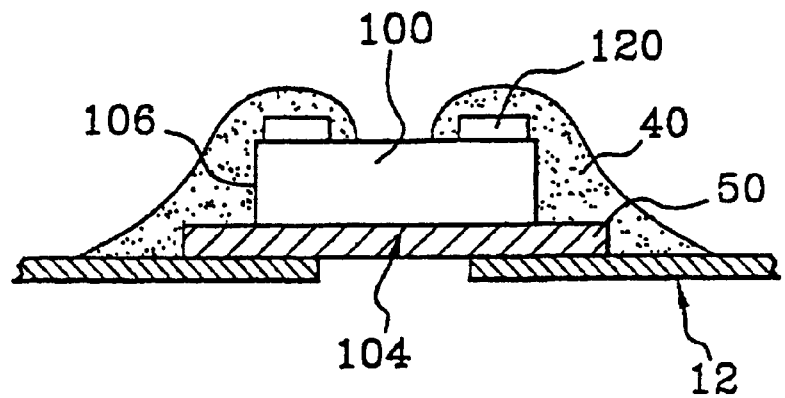
FIG. 1, already described, is a diagram in section of the connection of a chip with the dispensing of conductive resin.
Figure 2:
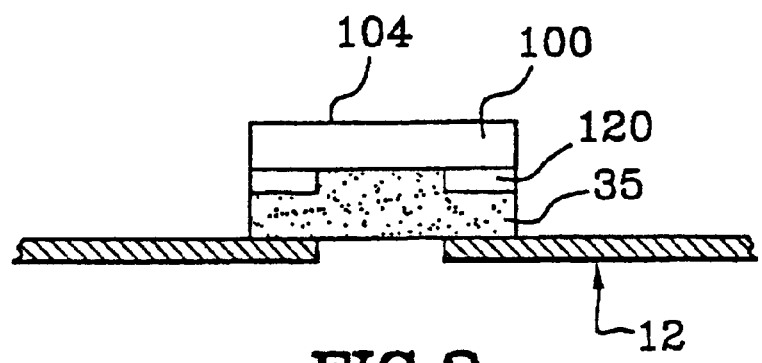
FIG. 2, already described, is a diagram in section of the connection of a chip according to a "flip chip" technique with conductive glue.
Figure 3:
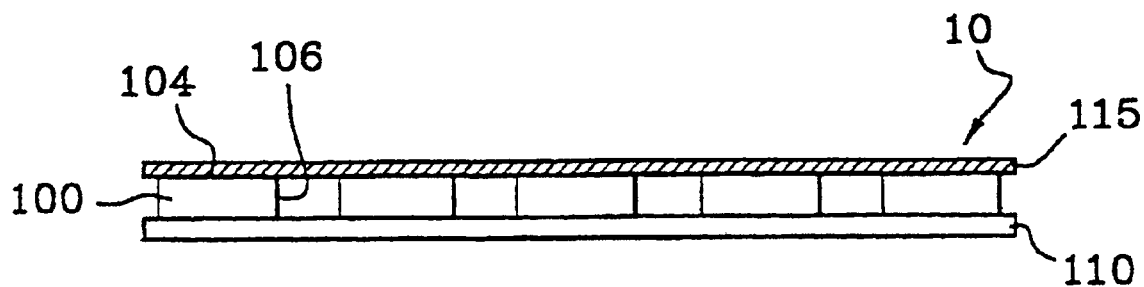
FIG. 3 is a schematic view in section of the cut-out silicon wafer.

A second step, illustrated in FIG. 3, consists placing the circuit chips 100, active face downwards, on a support 110. The function of this support is essentially to keep the circuit chips 100 in cohesion and to enable them to be manipulated for the following protective step.

The adhesive 115 on the rear face, already degraded by the ultraviolet radiation, is removed by peeling off for example, in order to leave the rear faces 104 of the chips 100 bare.

According to a preferential embodiment, the support 110 consists of another degradable adhesive.

Another function of the support 110 is to protect the active face of the chip 100 when the insulating material is applied.

The third step of the method according to the invention consists in applying an insulating material 150 to the rear face 104 of the chips 100 placed on the support 110.

Advantageously, the insulating material 150 consists of a low-viscosity resin so as to flow along the flanks 106 of the chips 100 in order to cover and protect them.

Different means can be used for the application of this insulating material 150.

Figure 4:
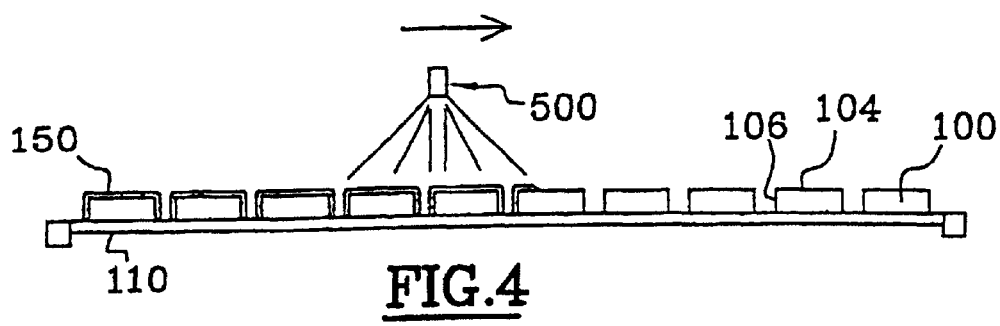
FIG. 4 illustrates the step of applying an insulating material to the rear and flanks of the chips according to a first variant embodiment.

A first method is illustrated in FIG. 4 and consists in spraying the insulating material 150 by means of a spray nozzle 500. This rain of insulating material will advantageously spread over the rear face 104 and over the flanks 106 of the chips 100 in order to form an insulating film.

Figure 5:
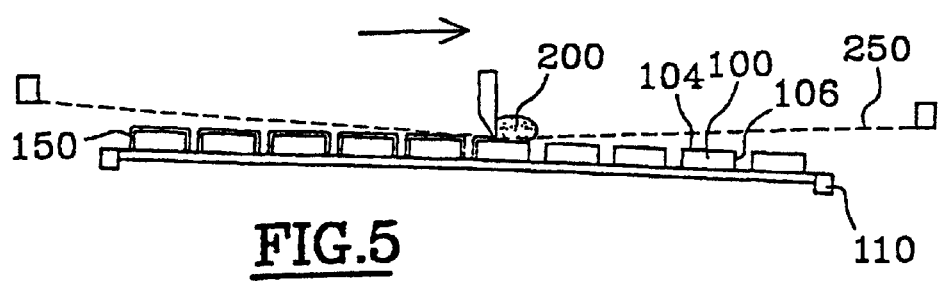
FIG. 5 illustrates the step of applying an insulating material to the rear and flanks of the chips according to a second variant embodiment.

A second method is illustrated in FIG. 5 and consists in spreading the insulating material 150 by screen-printing using a doctor. blade 200 and a screen 250. The screen printing ensures a deposition of the insulating material 150 with a geometry which is well defined by the screen 250.

Figure 6:
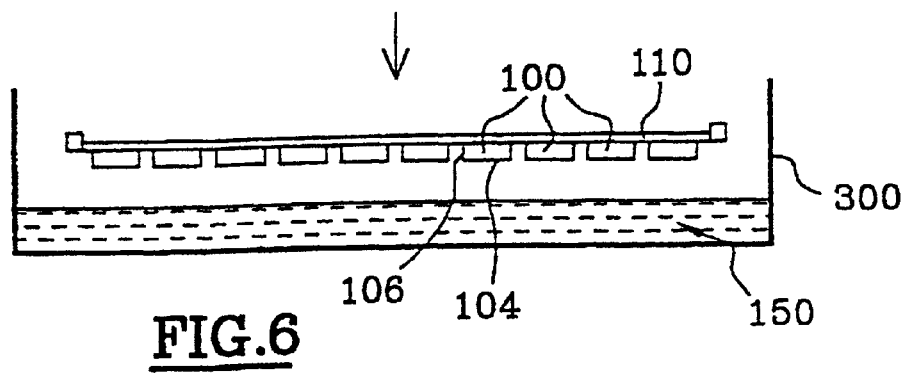
FIG. 6 illustrates the step of applying an insulating material to the rear and flanks of the chips according to a third variant embodiment.

A third method is illustrated in FIG. 6 and consists in applying the insulating material 150 by dipping the chips 100 in a tank 300 containing the insulating material 150.

Another method, not illustrated, consists in applying the insulating material 150 by means of a plate whirler, placing the chips 100 on a rotating rotary plate and dispensing the insulating material. The centrifugal force levels the lacquer on the chips and fills the gaps between the chips well.

Figure 7:
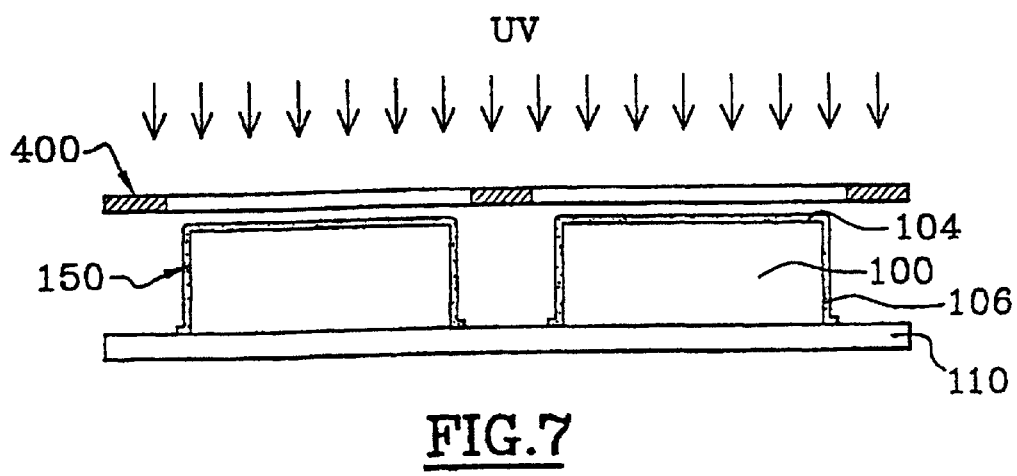
FIG. 7 illustrates the step of applying an insulating material to the rear and flanks of the chips according to a fourth variant embodiment.

Another method is illustrated in FIG. 7 and consists in applying a photosensitive insulating material 150. This photosensitive insulating resin 150 is deposited on the rear of the silicon wafer according to any one of the methods cited above. A mask 400 is then placed on the rear of the wafer 10 in order to mask the spaces between the chips 100. The rear of the wafer 10 is then exposed to ultraviolet radiation UV in order to polymerise the resin 150 on the entire surface except between the chips 100. This method has the advantage of facilitating the step of ejecting the chips.

The application of the insulating material can also be effected by a combination of the different methods cited above.

The insulating material 150 used for protecting the flanks 106 of the chips 100 can advantageously be a resin of the epoxy type having high hardness and good adhesion to silicon. Thus the resin 150 will adhere to the flanks 106 of the chips 100 and will break with a clean break when the chips are ejected.

The insulating material can also consist of a resin diluted to form a lacquer with a low dry extract for obtaining a thin homogeneous insulating layer.

Advantageously, the insulating material is a coloured resin making it possible to check the areas covered using an adapted tool such as computer-aided vision (CAV) for example.

According to another variant, the insulating material consists of a polymerisable photosensitive resin as already described with reference to FIG. 7.

After application of the insulating material 150, the chips 100 are ejected from the silicon wafer 10 in order to be connected in their place.

The ejection of the chips 100 can be effected by cutting out the support 110 between the chips 100 and/or by mechanical ejection, raising the chips 100 and breaking the resin between the chips 100.

The characteristics chosen for the insulating material are such that the breaking or cutting between the chips will be clean and will leave the flanks 106 of the chips 100 covered with the protective resin 150.

According to a preferential embodiment, the support 110 used for manipulating the chips 100 consists of a degradable adhesive. In such a case, after application of the insulating material, the wafer 10 is exposed to ultraviolet radiation., for example, in order to degrade the support 110 and to reduce its adhesive strength.

Where a photosensitive resin has been used, the polymerisation by exposure to ultraviolet will also have degraded the support 110. In addition, in this method, the resin has not been polymerised between the chips and can be washed. The chips 100 can therefore easily be detached from the support 110 and taken away in order to be connected in their module, which simplifies the step of ejecting the chips 100.

The integrated circuit chips 100 are therefore detached from the wafer 10 and be connected according to any type of electronic mounting or assembly using conductive polymer materials for effecting their connection to various connection points or to a communication interface with antenna or contacts, given that the flanks 106 of the chips 100 are protected by the insulating material 150.

By way of example, the fine layer of insulating material deposited on the flanks of the chip can have a. thickness of between approximately 5 and 10 $\mu$m. The protection obtained is a continuous and homogeneous fine layer consisting of the same layer which covers the rear face and the flanks of the chips without filling the cutting path between the chips. The layer follows and substantially reproduces the external surface of the chips.

What is claimed is:

1. A method for protecting integrated circuit chips on a silicon wafer, the wafer having a front face on which the integrated circuit chips are disposed and an opposite rear face, comprising the following steps:
    cutting the silicon wafer so as to disconnect the integrated circuit chips and;
    applying a conformal fluid insulating material to the rear face of the wafer so as to cover the flanks of each integrated circuit chip with a thin insulating layer.

2. A method for protecting integrated circuit chips according to claim 1, including the further step of transferring the cut-out wafer, with the rear face upwards, onto a support so as to ensure the cohesion of the chips during the application of the insulating material.

3. A method for protecting integrated circuit chips according to claim 1, wherein the application of the insulating material is effected by spraying on the rear face of the chips.

4. A method for protecting integrated circuit chips according to claim 1, wherein the application of the insulating material is effected by screen printing using a doctor blade and a screen on the rear face of the chips.

5. A method for protecting integrated circuit chips according to claim 1, wherein the application of the insulating material is effected by pouring on the rear face of the chips.

6. A method for protecting integrated circuit chips according to claim 1, wherein the application of the insulating material is effected by dipping the chips in a tank containing the insulating material.

7. A method for protecting integrated circuit chips according to claim 1, wherein the application of the insulating material is effected by dispensing the insulating material on the rear face of the chips while said chips are located on a rotating rotary tray.

8. A method for protecting integrated circuit chips according to claim 1, wherein the insulating material has low viscosity so as to run along the flanks of the chips.

9. A method for protecting integrated circuit chips according to claim 1, wherein the insulating material consists of a resin of the epoxy type having high hardness and good adhesion to the silicon.

10. A method for protecting integrated circuit chips according to claim 1, wherein the insulating material consists of an insulating lacquer with a low dry extract so as to obtain a thin insulating coating.

11. A method for protecting integrated circuit chips according to claim 1, wherein the insulating material consists of a coloured resin so as to allow a check on the areas covered with the insulating material.

12. A method for protecting integrated circuit chips according to claim 11, wherein the check on the areas covered with the insulating material is effected by computer-aided vision.

13. A method for protecting integrated circuit chips, comprising the following steps:

deposition of a protection on the rear face of a silicon wafer on which said chips are disposed;

cutting the silicon wafer so as to disconnect each integrated circuit chip;

transferring the disconnected integrated circuit chips, rear face upwards, onto a support;

removing the protection from the rear face;

applying a conformal insulating material to the rear face and the flanks of the chips;

ejecting the chips from the support and;

connecting the chips.

14. A method for protecting integrated circuit chips according to claim 13, wherein the protection of the rear face of the silicon wafer consists of an adhesive which is degradable under ultraviolet, said adhesive being degraded after the step of cutting the wafer and removed by peeling off.

15. A method for protecting integrated circuit chips according to claim 13, wherein the support is a degradable adhesive exposed to ultraviolet radiation after application of the insulating material.

16. A method for protecting integrated circuit chips according to claim 13, wherein the ejection of the chips is effected by breaking the insulating material deposited on the support between the chips.

17. A method for protecting integrated circuit chips according to claim 13, wherein the ejection of the chips is effected by cutting the support.

18. A method for protecting integrated circuit chips according to claim 13, wherein the insulating material consists of a photosensitive resin polymerised through a mask at the level of the rear faces and flanks of the chips.

19. A method for protecting integrated circuit chips according to claim 18, wherein the chips are disconnected by exposing the wafer to ultraviolet radiation through a mask so as to facilitate the ejection of the chips.

20. A method for protecting integrated circuit chips according to claim 13, wherein the insulating material consists of a photosensitive resin polymerised through a mask at the level of the rear faces and flanks of the chips.

21. An integrated circuit chip having a protection applied to its flanks and its rear face consisting of a conformal continuous and thin layer of insulating material.

22. An integrated circuit chip according to claim 21, wherein the insulating material covering said flanks consists of at least one of a resin of the epoxy type, an insulating lacquer, a polymerised photosensitive resin, and a coloured resin.

23. An integrated circuit chip according to claim 21, wherein said layer has a thickness of between approximately 5 and 10 $\mu$m.

24. An electronic circuit containing an integrated circuit chip having a conformal continuous, thin layer of insulating material on its flanks and rear surface, said chip being connected to said circuit by a conductive polymer material.

* * * * *